(12) United States Patent
Londergan et al.

(10) Patent No.: US 7,164,203 B1
(45) Date of Patent: Jan. 16, 2007

(54) METHODS AND PROCEDURES FOR ENGINEERING OF COMPOSITE CONDUCTIVE BY ATOMIC LAYER DEPOSITION

(75) Inventors: Ana R. Londergan, Campbell, CA (US); Thomas E. Seidel, Sunnyvale, CA (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 11/216,750

(22) Filed: Aug. 30, 2005

Related U.S. Application Data

(62) Division of application No. 10/122,643, filed on Apr. 12, 2002.

(60) Provisional application No. 60/284,326, filed on Apr. 17, 2001.

(51) Int. Cl.
*H01L 23/48* (2006.01)
*H01L 23/52* (2006.01)
*H01L 29/40* (2006.01)

(52) U.S. Cl. ............. 257/751; 257/753; 257/758; 257/E21.016; 257/E21.021

(58) Field of Classification Search ........... 257/753, 257/751, 758, E21.016, E21.021
See application file for complete search history.

(56) References Cited

U.S. PATENT DOCUMENTS

| 6,555,909 B1 * | 4/2003 | Lopatin et al. ............. 257/751 |
| 6,627,462 B1 * | 9/2003 | Yang et al. .................. 438/3 |
| 6,664,186 B1 | 12/2003 | Callegari et al. |
| 6,727,169 B1 | 4/2004 | Raaijmakers et al. |
| 7,038,284 B1 * | 5/2006 | Haukka et al. ............. 257/411 |
| 2003/0057553 A1 | 3/2003 | DelaRosa et al. |

\* cited by examiner

*Primary Examiner*—Evan Pert
*Assistant Examiner*—Victor A. Mandala, Jr.
(74) *Attorney, Agent, or Firm*—Sonnenschein Nath & Rosenthal LLP

(57) ABSTRACT

A composite film comprised of three layers is formed by ALD on a substrate with a substrate interface surface. A first layer is coupled to the substrate interface surface. The first layer provides adhesion to the substrate interface surface and initiation of layer by layer ALD growth. A second layer is positioned between the first and third layers and provides a conducting diffusion barrier between the substrate and subsequent overlaying film. A third layer has a surface that is configured to provide adhesion and a texture template in preparation for a subsequent overlaying film. The composite engineered barrier structures are applied to interconnect, capacitor and transistor applications.

14 Claims, 14 Drawing Sheets

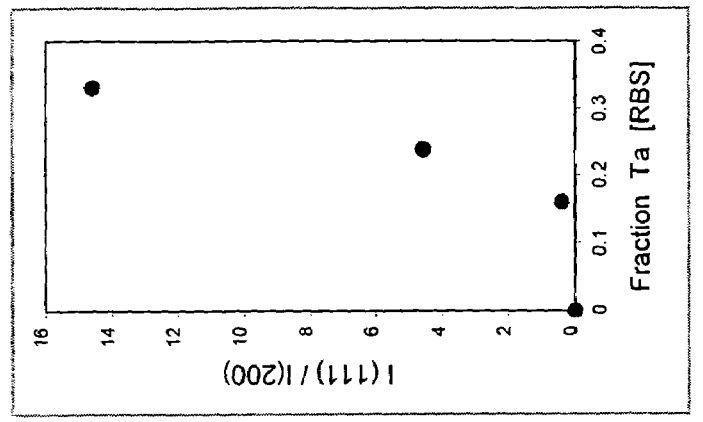
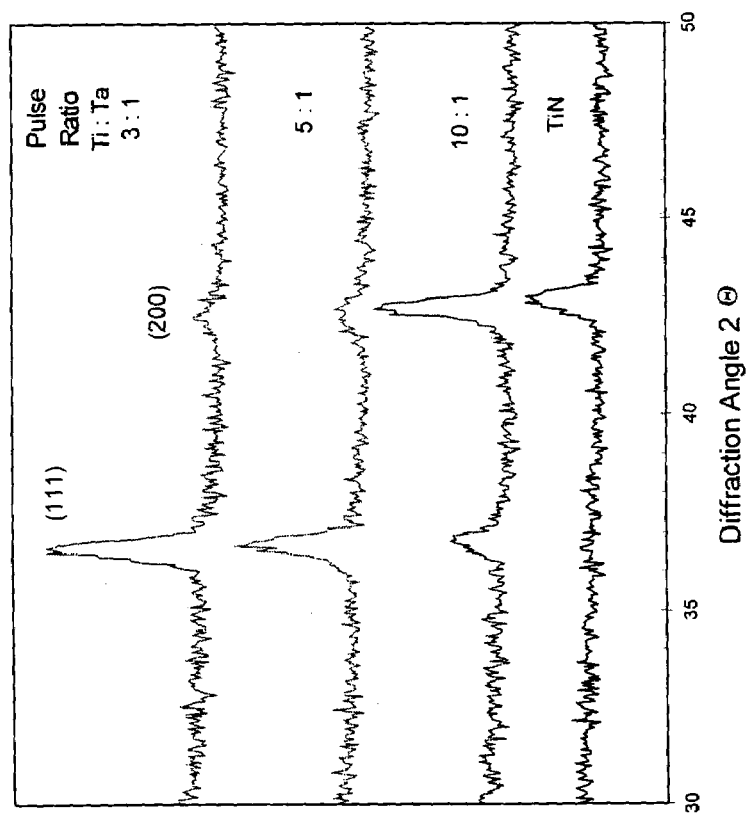
Figure 8 (a) and (b)

METHODS AND PROCEDURES FOR ENGINEERING OF COMPOSITE CONDUCTIVE BY ATOMIC LAYER DEPOSITION

CROSS-REFERENCE TO RELATED APPLICATIONS

The present patent application is a Divisional of U.S. patent application Ser. No. 10/122,643, filed Apr. 12, 2002, which claims the benefit of provisional application Ser. No. 60/284,326 filed on Apr. 17, 2001, which application is fully incorporated herein by reference.

STATEMENT AS TO FEDERALLY SPONSORED RESEARCH

This invention was made with the support of the United States government under contract # DASG60-99-C-0076 under an SBIR sponsored project by the Ballistic Missile defense organization. The United States may have certain rights in the invention.

BACKGROUND

1. Field of the Invention

The present invention relates generally to engineering of conductive films, and more specifically to methods of engineering of composite thin conductive films by atomic layer deposition technology.

2. Description of the Related Art

Thin conductive films are used in the fabrication of integrated circuits to route signals through and between many of the device elements of an integrated circuit, including interconnect lines, capacitor and gate electrodes, and contacts to the source and drain transistor regions. Traditionally, interconnect lines are fabricated from aluminum and are embedded in $SiO_2$ dielectric insulation. In recent years leading microelectronics manufacturers have begun the implementation of copper (Cu) and low dielectric constant (low-K) materials to enable improvement in device performance by lowering the signal propagation time delay. An important aspect of copper metallization is the need for a diffusion barrier to completely encapsulate the Cu interconnect lines in order to prevent Cu diffusion into the low-k material, which can degrade performance and yield. The barrier material and deposition method need to be carefully designed to avoid compromising the resistivity and reliability of the interconnect system. For example, the effective copper conductance across the interconnect line can be maximized by the use of a thin, uniformly deposited barrier layer. As illustrated in FIG. 1, the barrier thickness requirements rapidly approach less than 75 Å to retain 90% of the conductivity benefit of copper at feature size (FS) of 0.18 µm and below, and the historical industry trend is continuous scaling to smaller feature sizes and higher aspect ratios (ratio of depth to width of the features). Copper interconnect lines are fabricated with a damascene process, where the Cu is deposited inside trench and via openings defined in the insulating material. Advanced metallization technologies deposit the Cu simultaneously in the lines and vias in a dual damascene process, where the aspect ratios may exceed 10:1. Therefore, innovative ultra-thin barrier material is needed with good diffusion barrier properties and low resistivity, that is 100% conformal along aggressively scaled topographies. Other key integration requirements are low resistivity, good adhesion to the both Cu and low-K materials, ability to promote preferred Cu texture, low deposition temperature, and thermal stability within the constraints of the back-end-of-the-line (BEOL) thermal budget, typically less than or ~650° C., and long-term device operation. These functions put conflicting requirements on the material properties of the barrier, and this may be difficult to accomplish by just one film composition. One approach to meet these requirements is to employ barrier films composed of multiple sub-layers with tuned properties. In this respect, there is a need for composite barrier films. There also is a suitable technique, atomic layer deposition (ALD), which has the ability to grow ultra-thin conformal films with high precision control of thickness and to engineer the composition (T. Suntola, Thin Solid Films 216, p. 84, 1992, Sneh et al., Thin Solid Films, Vol. 402/1-2, pp. 248–261, January 2002).

Titanium nitride (TiN) is the commonly used barrier material with aluminum metallization. However, TiN is not likely to meet the challenges associated with extendibility to sub-0.18 µm and copper, because its diffusion barrier properties deteriorate as the film thickness is scaled down. Barrier materials naturally superior to TiN are the nitrides of the heavier refractory metals tantalum and tungsten.

TaNx-based materials have become the material of choice for copper barrier in present day IC manufacturing. TaN is a good barrier, however it has high resistivity and poor adhesion to Cu. On the other hand, Ta has good adhesion to Cu and lower resistivity, but it fails as a barrier. It has been established that some N incorporation in the metal film is essential for good barrier performance. However, it has been also established that the barrier/dielectric and barrier/Cu adhesion have conflicting dependencies on the percent of N in the barrier (Edelstein et al., IEDM Conference Proceedings 2001, IEEE, p. 9). Thus, some barrier film engineering is necessary and TaNx, or TaNx/Ta bi-layers have emerged as the barriers of choice (Edelstein et al., IEDM Conference Proceedings 2001, IEEE, p. 9).

The dominant technique for deposition of these advanced Cu barriers is ionized physical vapor deposition (IPVD). IPVD is a variant of sputter-deposition technology, where the sputtered atoms are ionized by the application of a magnetic field to improve step coverage. PVD techniques have the advantage of maturity, long history of application in the IC industry, good control of film composition. However, even the state of the art TaNx film deposition technologies only approach 33% step coverage in currently manufactured device geometries. Additionally, PVD deposited composite films containing more than one metal element may suffer from non-uniform film composition along the side wall of the features.

For improving the step coverage the dominant technique for deposition of thin films in the art has been chemical vapor deposition (CVD), which has proven to have superior ability to provide uniform even coatings, and to coat relatively conformally into vias and over other high-aspect ratio and uneven features in wafer topology. As device density has continued to increase and geometry has continued to become more complex, even the superior conformal coating of CVD techniques has been challenged, and new and better techniques are needed. Additionally, CVD processes generally have very narrow window for fabrication of multi-component films and the control over film composition is not as precise as in PVD. Furthermore, issues related to the CVD system complexity, cost and maintenance are encountered.

The approach of a variant of CVD, Atomic Layer Deposition (ALD) has been considered for improvement in uniformity, conformality, and control of film composition, especially for low temperature deposition, appropriate for interconnect BEOL processing requirements.

Atomic Layer Deposition is emerging as a promising candidate to extend the abilities of CVD techniques, and is under rapid development by semiconductor equipment manufacturers to further improve characteristics of chemical vapor deposition. ALD was originally termed Atomic Layer Epitaxy by T. Suntola (Suntola and J. Ashton, U.S. Pat. No. 4,058,430). Generally, ALD is a process wherein conventional CVD processes are divided into single deposition steps, wherein each separate deposition step theoretically goes to saturation at a single or a fraction of a monolayer thickness, and self-terminates.

The deposition is the result of chemical reactions between reactive molecular precursors and the reactive surface of the growing film. In similarity to CVD, elements composing the film are delivered as molecular precursors. The net reaction deposits the pure desired film and eliminates the byproducts. In the case of CVD the molecular precursors are fed simultaneously into the CVD reactor. A substrate is kept at temperature that is optimized to promote chemical reaction between the molecular precursors concurrent with efficient desorption of the byproducts.

For ALD applications, the molecular precursors are introduced into the ALD reactor separately. This is practically done by flowing one precursor at a time, i.e., a metal precursor—$ML_x$(M=Ti, Al, W, Ta, Si etc.) that contains a metal element—M which is bonded to atomic or molecular ligands—L to make a volatile molecule. The metal precursor reaction is typically followed by inert gas purging to eliminate this precursor from the chamber prior to the separate introduction of the other precursor. The second type of precursor is used to grow the desired film and restore the surface reactivity towards the metal precursor.

Most ALD processes have been applied to deposit compound films. In this case the second precursor is composed of a desired (usually nonmetallic) element (i.e., O, N), and hydrogen such as, for example $H_2O$ or $NH_3$. Specifically, oxides are formed when $H_2O$ is used, and nitrides, when $NH_3$ is employed. FIG. 2 illustrates the process for the formation of TiN and TaNx films by ALD. TiN is grown by alternating $TiCl_4$ and $NH_3$ pulses. Purge step is performed after every pulse to remove the precursor from the deposition chamber. Similarly, TaNx is deposited from sequential $TaCl_5$ and $NH_3$ pulses. Methods for thermal and plasma assisted ALD processes now exist for the deposition of elemental materials (J. W. Klaus et al., Appl. Phys. Lett. 70, 1997, p. 1092; Imai et al., 1993). Plasma assisted ALD can also be used for the deposition of compound films (O. Sneh, U.S. Pat. No. 6,200,893, 2001).

The sequence of surface reactions that restores the surface to the initial state is called the ALD deposition cycle. By repeating the ALD cycles, films can be layered down in equal metered sequences that are all identical in chemical kinetics, deposition per cycle, composition and thickness. Self-saturating surface reactions make ALD insensitive to transport non-uniformity either from flow engineering or surface topography (i.e., deposition into high aspect ratio structures). Non uniform precursor flux can only result in different completion time at different areas of the wafer. However, if each of the reactions is allowed to complete on the entire substrate area, the different completion kinetics has no disadvantage.

Some research has been done on conducting film deposition by ALD for barrier applications (A. Satta et al., Mat. Res. Soc. Symp. Proc. Vol. 612, 2000, p. D6.5.1, MRS; P. Martensson et al., J. Vac. Sci. Technol. B 17, p. 2122, 1999) however composite conductive film engineering has not been documented. A related effort in the integration of copper interconnects using atomic layer deposition has included the concept of a barrier and a Cu pre-seed by ALD followed by a CVD seed (S. Lopatin et al., U.S. Pat. No. 6,368,954, 2002). This approach is related art to the concept disclosed here by commonality of application, but does not address the detailed design and structure of the ALD barriers.

There is a need for diffusion barrier films that simultaneously address and satisfy the requirements for incorporation in advanced microelectronics devices, such as, good diffusion barrier properties, low resistivity, 100% conformallity along aggressively scaled topographies, good adhesion to both the Cu and low-K materials, ability to promote preferred Cu texture, with deposition temperature and thermal stability within the constraints of the BEOL thermal budget, and the like.

SUMMARY

Accordingly, an object of the present invention is to provide composite films by ALD that provide optimization for surface activation and/or adhesion.

Another object of the present invention is to provide composite films by ALD that have good barrier quality.

Yet another object of the present invention is to provide composite films by ALD that have good resistivity.

Still another object of the present invention is to provide composite films by ALD that have good texture.

Another object of the present invention is to provide composite films that take advantage of the ALD step coverage and precise control of film composition and thickness.

These and other objects of the present invention are achieved in a composite film that is formed on a substrate with a substrate interface surface. A first layer is coupled to the substrate interface surface. The first layer provides adhesion to the substrate interface surface and initiation of layer by layer ALD growth. A second layer is positioned between the first and third layers and provides a conducting diffusion barrier between the substrate and subsequent overlaying film. A third layer is configured to provide adhesion and a texture template in preparation for a subsequent overlaying film.

In another embodiment of the present invention, a composite film is formed on a substrate with a substrate interface surface. A first layer is coupled to the substrate interface surface. The first layer provides adhesion to the substrate interface surface and initiation of layer by layer ALD growth. A second layer is positioned between the first and third layers and provides a conducting diffusion barrier between the substrate and subsequent overlaying film. A third layer is configured to provide adhesion and a texture template in preparation for a subsequent overlaying film. At least one of a transition region between the first and second layers or the second and third layers has a graded composition.

In another embodiment of the present invention, a composite film is formed on a substrate with a substrate interface surface. A first layer is coupled to the substrate interface surface. The first layer provides adhesion to the substrate interface surface and initiation of layer by layer ALD growth. A second layer is positioned between the first and third layers and provides a conducting diffusion barrier between the substrate and subsequent overlaying film. A third layer is configured to provide adhesion and a texture template in preparation for a subsequent overlaying film. The second layer includes a micro-layered structure.

In another embodiment of the present invention, a metal insulator-metal structure (MIM structure) includes an upper metal layer. An upper composite engineered barrier layer is made by an ALD process. A lower composite engineered barrier layer is made by an ALD process. An insulator is positioned between the upper and lower composite engineered barrier layer. A lower metal layer is included.

In another embodiment of the present invention, a metal insulator-metal structure (MIM structure) includes an upper metal layer. A composite engineered barrier layer made by an ALD process is included. An insulator is positioned between the upper metal layer and the composite engineered barrier layers. A lower metal layer is included.

In another embodiment of the present invention, a metal insulator-metal structure (MIM structure) includes an upper metal layer. A composite engineered barrier layer made by an ALD process is also provided. A lower metal layer is also included. An insulator is positioned between the lower metal layer and the composite engineered barrier layer.

In another embodiment of the present invention, a metal insulator-metal structure (MIM structure) is positioned between any two levels of Cu interconnects in a multi-level Cu interconnect system. An upper Cu interconnect metal layer is provided. An upper composite engineered barrier layer made by an ALD process is provided. A lower composite engineered barrier layer made by an ALD process is provided. An insulator is positioned between the upper and lower composite engineered barrier layers. A lower Cu interconnect metal layer is included.

In another embodiment of the present invention, a dual work function metal gate MOSFET transistor structure has a silicon substrate with an insulator on the substrate. A composite engineered barrier layer made by an ALD process is provided. A low resistivity metal gate is provided.

In another embodiment, a dual work function Cu metal gate MOSFET transistor structure has a silicon substrate with an insulator on the substrate. A composite engineered barrier layer made by an ALD process, and a low resistivity Cu metal gate are provided.

BRIEF DESCRIPTION OF THE DRAWINGS

FIG. 8 illustrates characteristics of composite engineered films of the present invention by showing: (a) Normal incidence XRD plot of ~400 Å thick Ti—Ta—N composite films formed with different pulse ratios; (b) Ratio of the intensities of the (111) and (200) XRD reflection peaks as function of Ta fraction by RBS.

DETAILED DESCRIPTION OF THE PREFERRED EMBODIMENTS

In various embodiments, the present invention provides Composite Engineered Barrier films by ALD structure or ("CEBA"). The CEBA films of the present invention are layered structures, composed of different materials to provide optimization for surface activation/adhesion, barrier quality, resistivity and texture.

When the reactions in an ALD process are allowed to reach saturation, kinetics factors no longer play a role and the film growth is controlled by thermodynamics. As a result, the material properties, such as structure, composition, and electrical conductivity are dictated by thermodynamics factors, such as temperature and minimization of surface free energy as the film grows. Consequently, the films exhibit the universal benefits of ALD: 100% conformability, high density, exceptional repeatability and thickness control, and moderate sensitivity to wafer size. Additionally, when the substrate surface is appropriately prepared to be chemically reactive with one of the precursors, ALD growth proceeds without nucleation, resulting in sharp interfaces with strong chemical bonding, which is highly desirable for good adhesion and barrier performance.

An example where thermodynamics factors promote the formation of a film with desirable properties is ALD of titanium nitride (TiN). There are number of reports on this process (A. Satta et al., Mat. Res. Soc. Symp. Proc. Vol. 612, 2000, p. D6.5.1, MRS; P. Martensson et al., J. Vac. Sci. Technol. B 17, p. 2122, 1999), and our results are in good agreement with reported data. For example, ALD TiN films deposited at 360° C. typically exhibit resistivity in the range of 400 to 500 μΩ-cm, which can be reduced to about 150 to 200 μΩ-cm by increasing the deposition temperature to 400° C.

Alternatively, ALD of tantalum nitride (Ta—N) is an example where thermodynamics factors do not promote the formation of a useful film. Ta—N films do exhibit the universal ALD characteristics, such as 100% step coverage, however they are highly resistive due to the formation of the $Ta_3N_5$ phase. Therefore, the thermodynamics of the process has to be changed to grow useful Ta—N-based films. For example, some control of ALD film properties can be gained by varying the deposition temperature. For instance, we found that sheet resistance could not be measured on films grown at 360° C., while 500 Å thick films deposited at 400° C. had a measurable resistivity of ~1 Ω-cm. However, the applicability of this approach is limited due to the low thermal budget of BEOL process integration. A more flexible approach that takes advantage of the cyclic character of the ALD deposition process is the formation of composite films and multi-layered structures.

Figure 1:
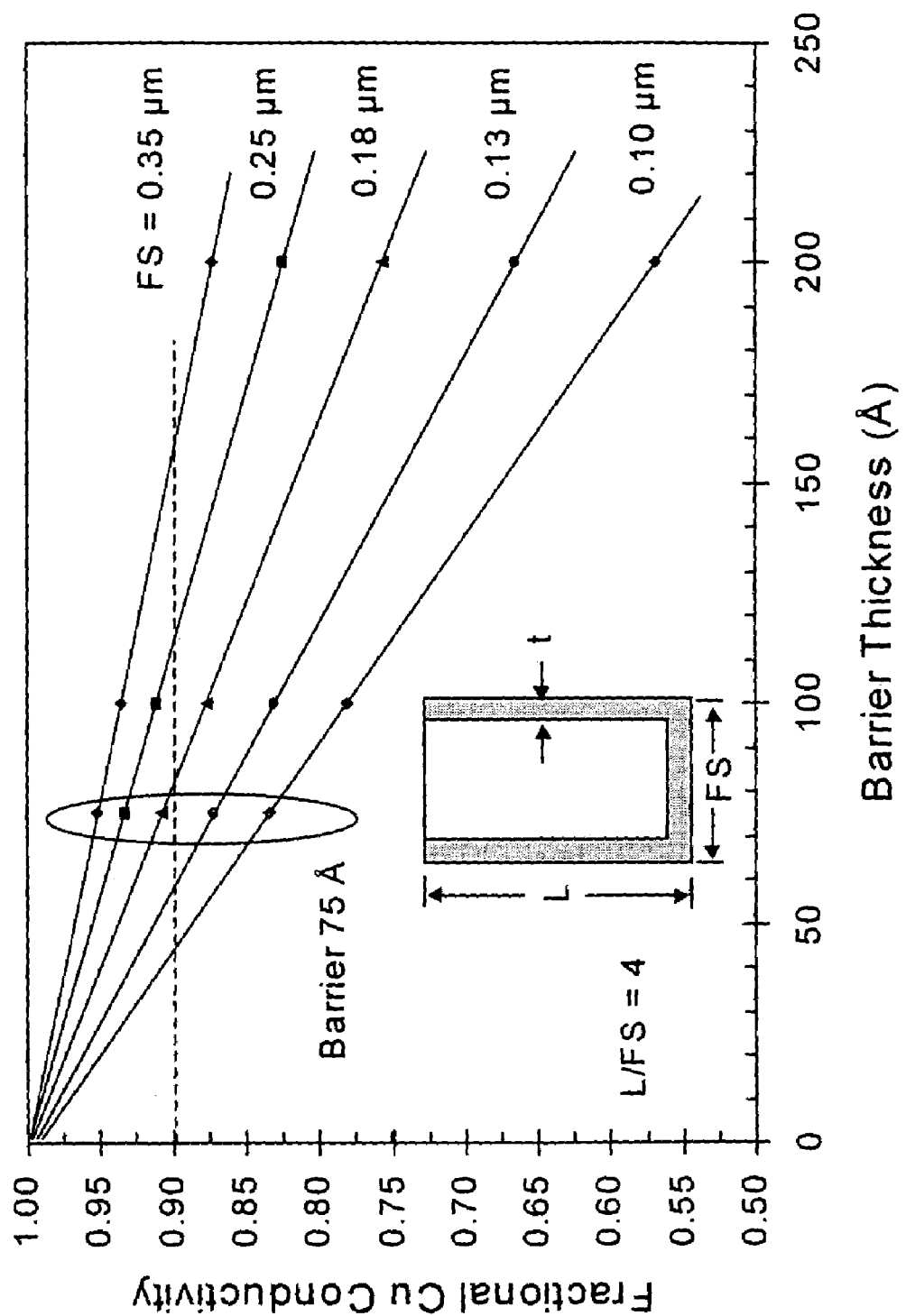
FIG. 1 is a prior art plot that illustrates the impact of the diffusion barrier thickness (t) on the effective copper conductivity, where the calculation is based on copper lines with width equal to the feature size (FS) and height L.
Figure 2:
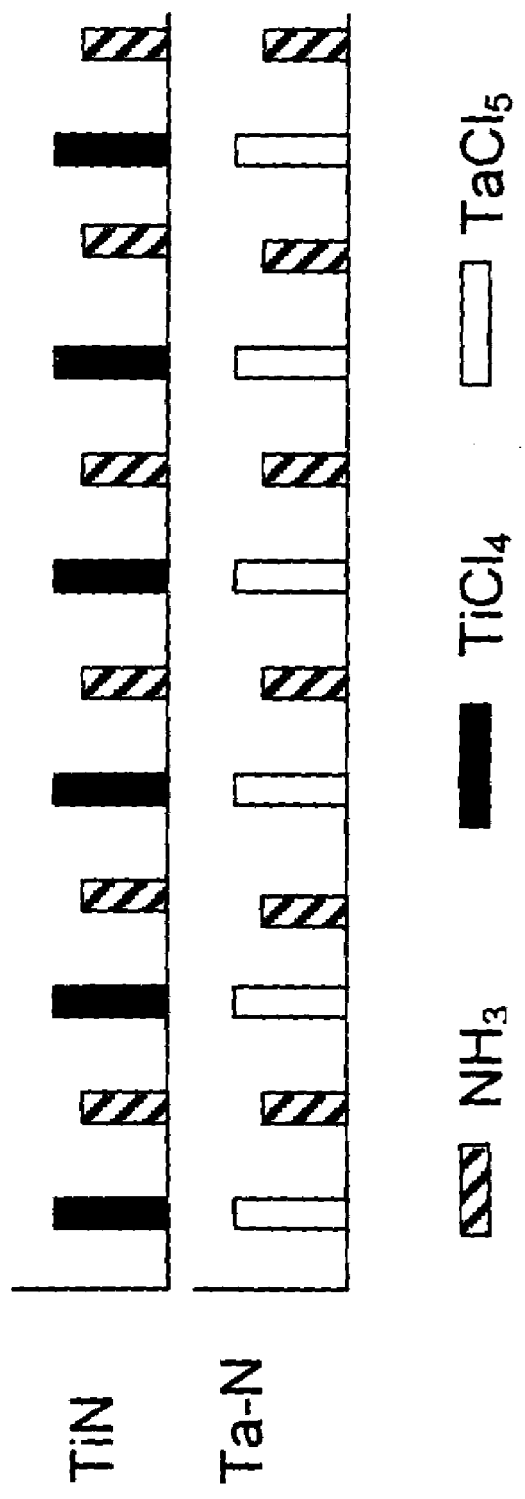
FIG. 2 is a prior art schematic illustration of the formation of TiN and TaNx films by ALD
Figure 3:
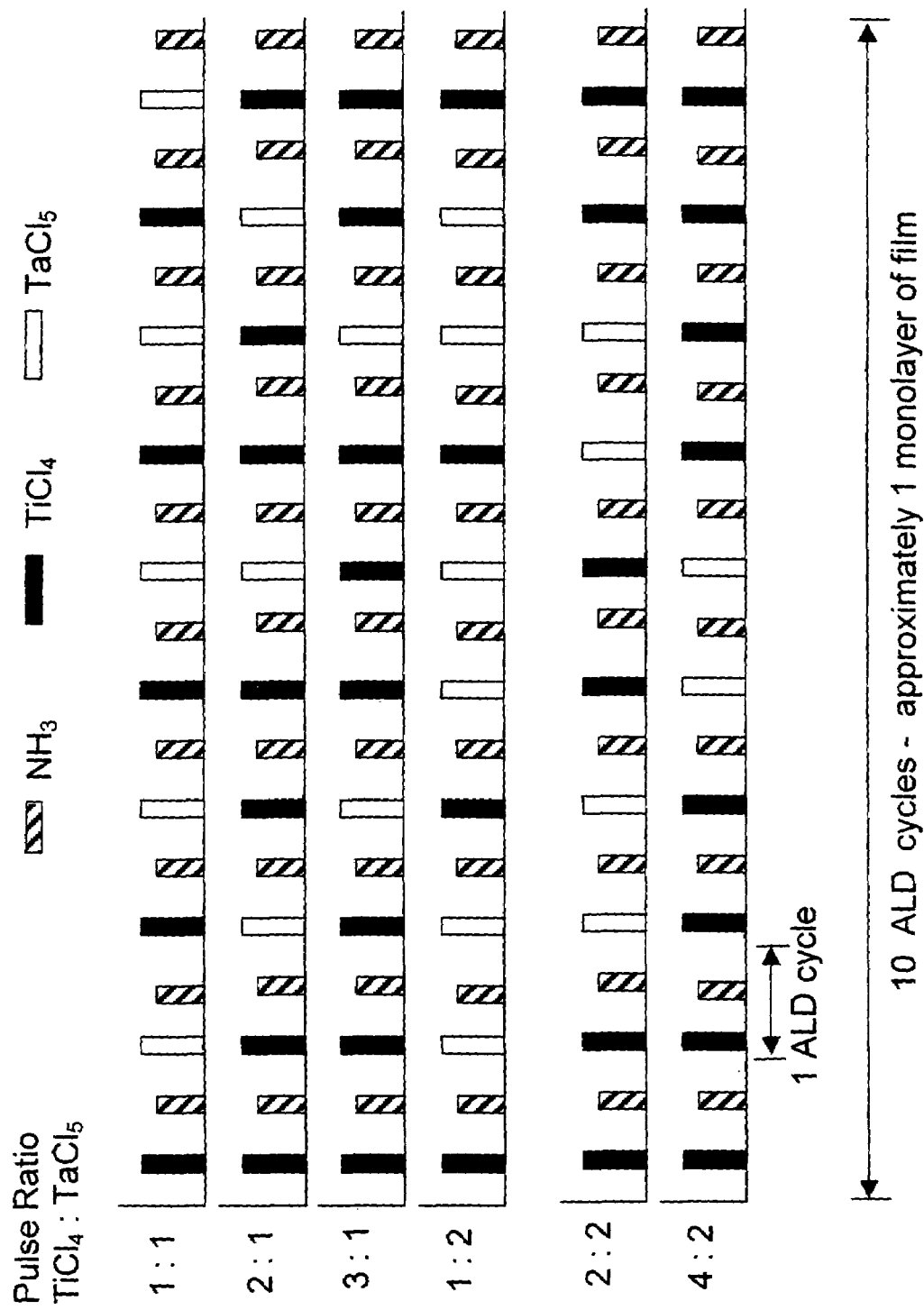
FIG. 3 is a schematic diagram that illustrates various embodiments for engineering composite Ti—Ta—N barriers by ALD (CEBA) of the present invention.

FIG. 3 illustrates the process for the formation of Ti—Ta—N composite films by ALD. Composite films are formed by switching between the metal precursors, $TaCl_5$ and $TiCl_4$, while $NH_3$ pulse follows every metal pulse. At no time are the Ti and Ta precursors introduced simultaneously in the ALD chamber. This separation is essential since the different kinetics of the $TaCl_5$ and $TiCl_4$ reactions would otherwise make the film growth dependent on precursor mass transport and flow non-uniformity. The gas delivery system allows alternation between the metal precursors to be done without throughput penalty (O. Sneh et al., Thin Solid Films, Vol. 402/1-2, pp. 248–261, January 2002). Different film composition can be achieved by selecting different $TiCl_4$ to $TaCl_5$ pulse ratios, as shown in FIG. 3.

Figure 4:
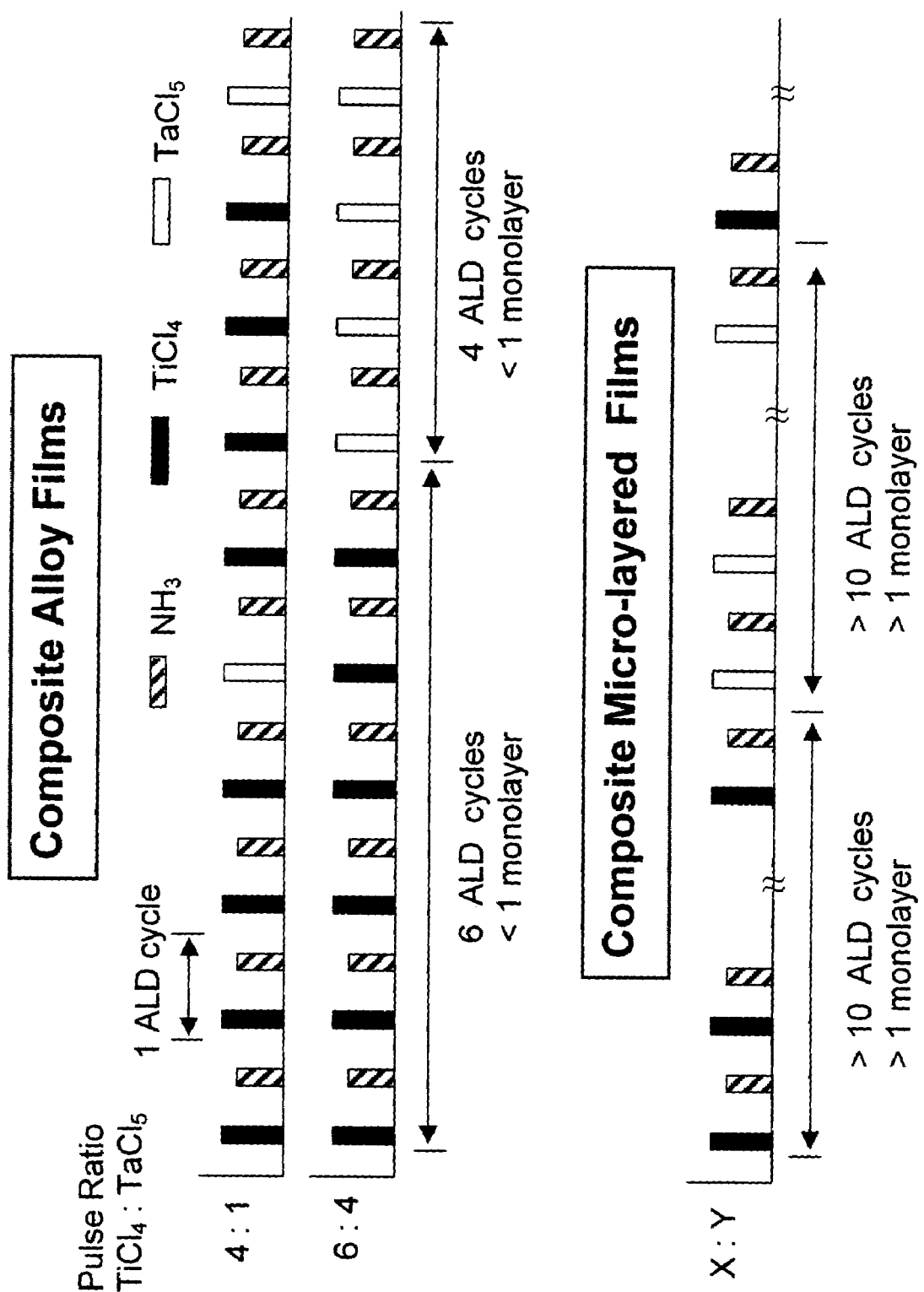
FIG. 4 is a schematic diagram that illustrates various embodiment for engineering composite Ti—Ta—N barriers by ALD (CEBA) of the present invention that illustrates the distinction between composite alloys and micro-layered films.

Typical growth rate for metal nitrides from chloride precursors and ammonia at 360° C. is ~0.35 Å/cycle. Therefore, approximately 10 cycles (or metal pulses) are needed to complete one atomic monolayer. As a result, the described growth method leads to the formation of composite alloy films. Alternatively, when more than 10 cycles of one or both materials are sequentially used to grow a composite film, the film consists of micro layers of the two materials, as illustrated in FIG. 4. Thus, same composite film thickness and average composition can be realized using large number of very thin (~1–3 monolayers thick) micro layers, or a smaller number of thicker (>3 monolayers) micro layers of different materials. The latter is referred to as "coarse" microlayering and the former is "fine" microlayering.

Inherent to ALD, the composite film thickness increases linearly as function of the number of cycles. In a case study we explored and characterized composite Ti—Ta—N films with a wide range of thickness and composition (A. R. Londergan et al., MRS Conference Proceedings 2001).

Figure 5:
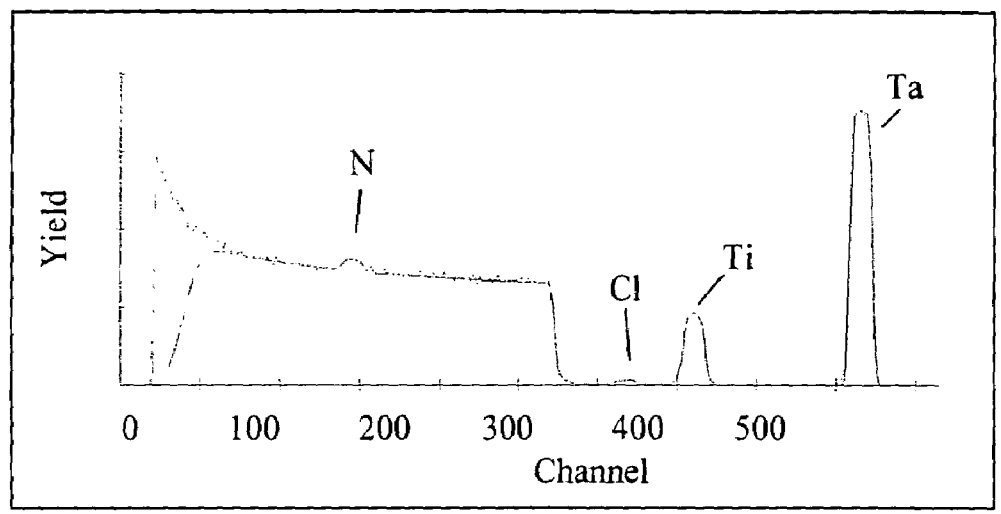
FIG. 5 illustrates characteristics of a composite engineered film of the present invention by showing RBS pattern of 650 Å thick Ti—Ta—N film formed by 5:1 TiCl$_4$ to TaCl$_5$ pulse ratio.
Figure 6:
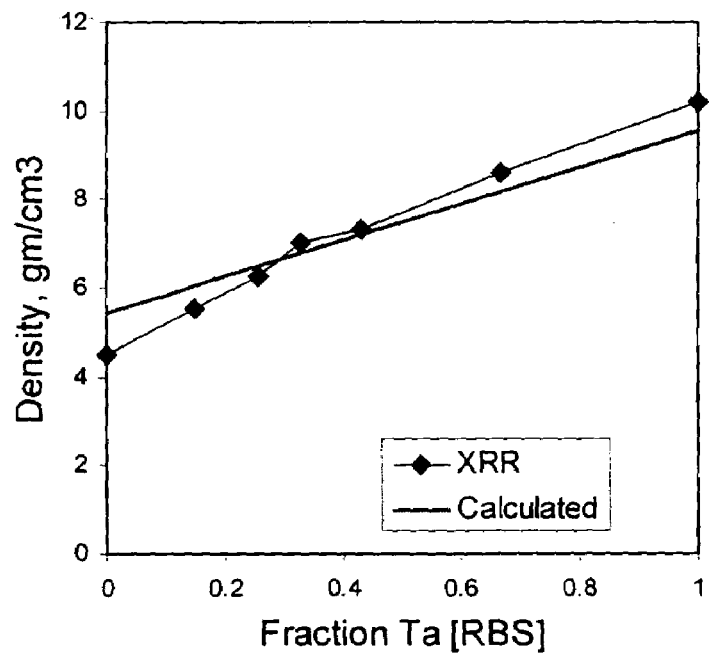
FIG. 6 illustrates characteristics of composite engineered films of the present invention by showing film density measured by XRR as function of Ta fraction determined by RBS, where the theoretical line is plotted for comparison.

With regard to film composition, Rutherford Backscattering Spectrometry (RBS) analysis showed that the actual Ti to Ta ratio in the films does not mach the pulse ratio that was used. For example, FIG. 5 displays the RBS pattern of a 650 Å thick Ti—Ta—N film formed using 5:1 $TiCl_4$ to $TaCl_5$ pulse ratio. Simulation of the spectrum gives 11% Ta, 32 at. % Ti, 53 at. % N, and 4 at. % Cl. Similarly, all composite films were found to have "excess" Ta. The fraction of Ta in the films, calculated as: (at. % Ta)/(at. % Ta+at. % Ti) from RBS was used to plot the film characteristics. In this representation, TiN and Ta—N films have Ta fraction of 0 and 1, respectively. We used fraction of Ta based on the higher accuracy of this number, compared to at. % Ta, which includes an error due to the lower sensitivity of RBS to nitrogen. Generally, RBS showed ~53 at. % N in films with Ta fraction <0.5, while alloys with higher Ta concentration had ~65 at. % N. There was ≦4 at. % Cl in all films. These levels of chlorine incorporation are typical for the selected deposition temperature and can be reduced by increasing the temperature. The density of the alloys determined by x-ray reflectivity (XRR) is in good agreement with theoretical calculations, as illustrated in FIG. 6. Such high film density is typically exhibited in films grown by ALD and is a prerequisite for good diffusion barrier properties.

Figure 7:
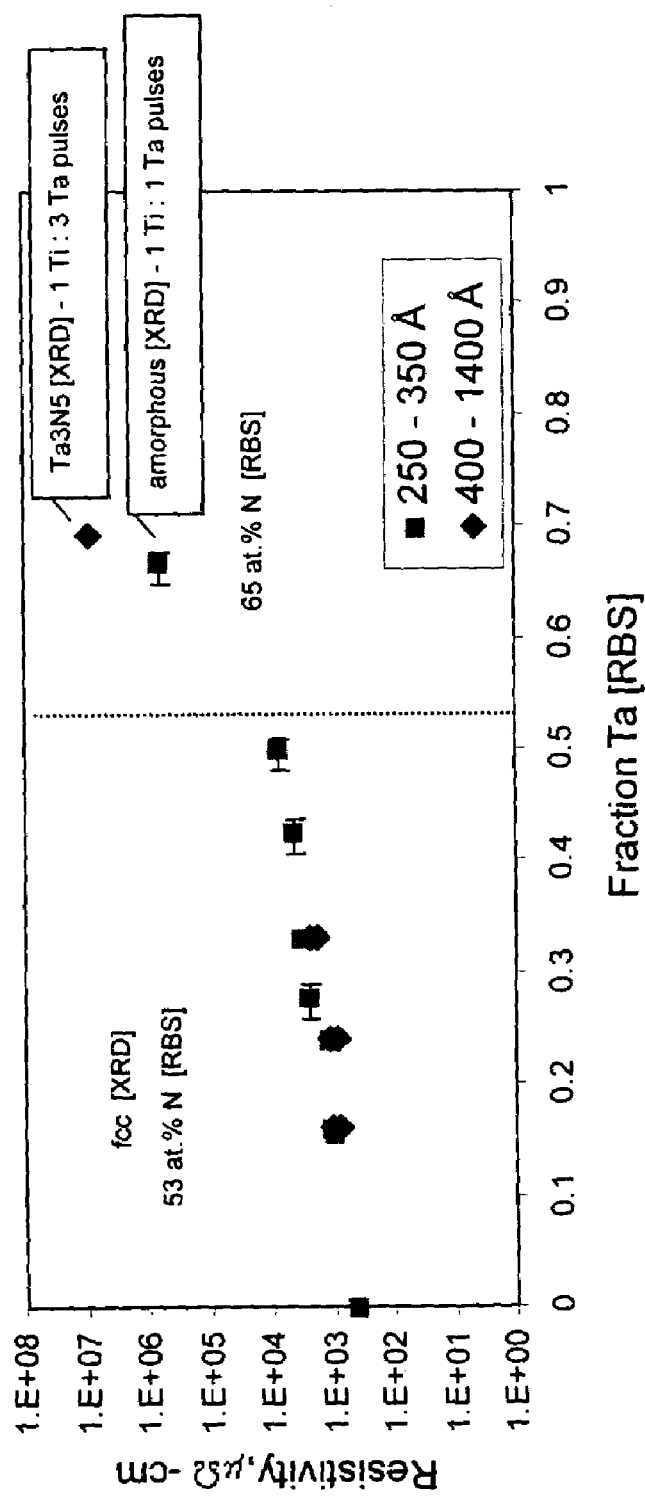
FIG. 7 illustrates characteristics of composite engineered films of the present invention by showing film resitivity as function of Ta fraction in the alloy determined by RBS.

With regard to resistivity and structure, as illustrated in FIG. 7, film resistivity increases exponentially as function of Ta fraction, until the latter reaches ~0.5. After that, resistivity increases very rapidly, and on Ta—N films (Ta fraction=1) resistivity could not be measured. The resistivity trend is in good correlation with the findings from x-ray diffraction (XRD). In particular, XRD showed that films with Ta fraction <0.5 form a face centered cubic (fcc) structure. The lattice parameter, calculated from the XRD peak positions, increases monotonically from 4.214 to 4.25 Å with increasing Ta fraction, suggesting that the Ta atoms are incorporated in the fcc TiN matrix. In reference, the values of fcc TiN and TaN from the Standard Powder Diffraction File, JCPDS, are 4.235 and 4.33 Å, respectively.

The only amorphous film was formed using 1:1 pulse ratio, however it had an unusable high resistivity (FIG. 7). XRD showed that further increase of Ta in the films resulted in the formation of the $Ta_3N_5$ structure, which explains the observed high resistivity. These results are also in agreement with the ~65 at. % N measured by RBS. Since no TiN peaks were detected in these XRD patterns, it is likely that the Ti atoms are incorporated in the $Ta_3N_5$ matrix.

One important finding is that the film microstructure (or texture) changes as a function of composition. FIG. 8(a) illustrates normal incidence XRD plots of ~400 Å thick Ti—Ta—N composite films deposited with different metal pulse ratios. As seen in the plot, TiN films exhibit (200) texture. The addition of Ta to the films results in the gradual appearance and increase in intensity of the (111) peak. The ratio of the intensities of the (111) and (200) XRD reflection peaks as function of Ta fraction is plotted in FIG. 8(b). Measurements on films with same composition but different thickness showed that this (111) preferred texture is maintained as the film grows. For the plot in FIG. 8(a), thickness of 400 Å was selected due to the good signal to noise ratio in the measured XRD patterns, as compared to thinner films.

Figure 9:
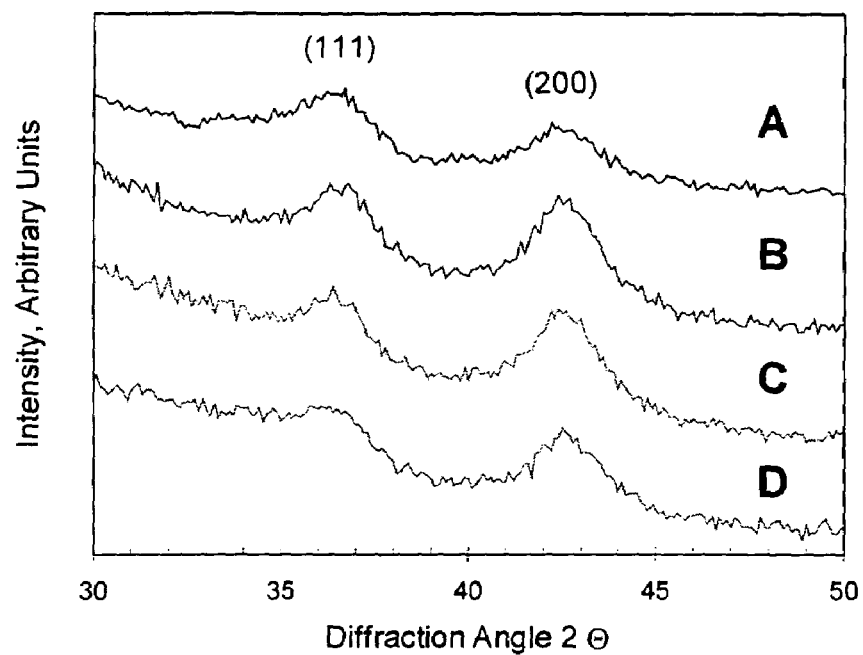
FIG. 9 illustrates characteristics of composite engineered films of the present invention by showing 1° low angle incidence XRD patterns of an alloy, grown using an alternation of 5 TiN and 1 TaNx cycles (sample A) and 3 microlayered samples (B, C, and D) consisting of alternation of 5:1, 10:2, and 20:4 monolayers of TiN and TaNx, respectively.
Figure 10:
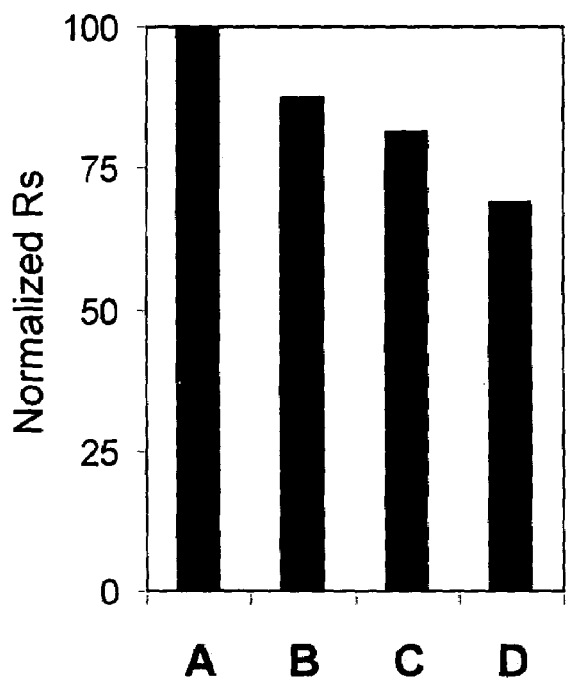
FIG. 10 illustrates characteristics of composite engineered films of the present invention by showing normalized sheet resistance of an alloy, grown using an alternation of 5 TiN and 1 TaNx cycles (sample A) and 3 microlayered samples (B, C, and D) consisting of alternation of 5:1, 10:2, and 20:4 monolayers of TiN and TaNx, respectively.

Engineering alloys and micro layers can be obtained with different micro-layering choices. For example, an alloy of approximately the same Ta:Ti ratio can be made using layer sequences with 5:1 cycles or 10:2 cycles or 20:4 cycles, and the like. The granularity of the micro-layering is selectable and adjustable by ALD. Table 1 shows the samples compared in a case study, where the ratio of the total number of $TiCl_4$ to $TaCl_5$ pulses was 5:1. Sample A was a composite alloy, grown using an alternation of 5 TiN and 1 TaNx cycles. Samples B, C, and D were microlayered, consisting of alternation 5:1, 10:2, and 20:4 TiN:TaNx monolayers, respectively. As discussed earlier, it takes ~10 cycles of the same material to grow one monolayer. FIG. 9 shows 1° low angle incidence XRD pattern of samples A, B, C, and D. All samples show the same XRD structure and texture, indicating that these characteristics are less dependent on the microlayering. In contrast, the resistivity of the composite films, all having the same average composition, decreases with increased thickness of the microlayers, as shown in FIG. 10. The important finding is that the resistivity can be reduced by optimizing the microlayering sequence the without loosing the preferred texture. That is, the coarseness of the microlayering controls the resistivity.

TABLE 1

| Pulse Ratio: 5 TiCl$_4$:1 TaCl$_5$ | Sample | TiN | TaNx |
|---|---|---|---|
| Alloy | A | 5 cycles | 1 cycle |
| Microlayering | B | 5 monolayers | 1 monolayer |
| | C | 10 monolayers | 2 monolayers |
| | D | 20 monolayers | 4 monolayers |

These phenomena might be related to the observation that thinner films have higher resistivity (a mean free path effect), and/or the result that alloys of metals may have higher resistivity than the resistivity of either of the pure element. Although the current results may have a phenomenological physical explanation along the lines described above, it is far from a-priori obvious, and the resistivity behavior must be determined empirically, which it was for the present case.

With regard to the composite engineered barriers by ALD of various embodiments of the present invention, the properties of selected composite alloy films are summarized in Table 2.

TABLE 2

| Pulse Ratio (Ti:Ta) | Fraction Ta [RBS] | Resistivity (µΩ-cm) | Density (gm/cm$^3$) [XRR] | Structure [XRD] | Texture [XRD] |
|---|---|---|---|---|---|
| 1:0 | 0 | ~400 | 4.51 | fcc | (200) |
| 10:1 | 0.16 | ~950 | 5.52 | fcc | random |
| 5:1 | 0.26 | ~1100 | 6.25 | fcc | (111) |
| 3:1 | 0.33 | ~3000 | 7.0 | fcc | (111) |
| 1:1 | 0.67 | ~0.65 × 10$^6$ | 7.32 | amorphous | N/A |
| 1:3 | 0.69 | ~9 × 10$^6$ | — | hexagonal | random |
| 0:1 | 1 | N/A | 10.2 | hexagonal | random |

Figure 11:
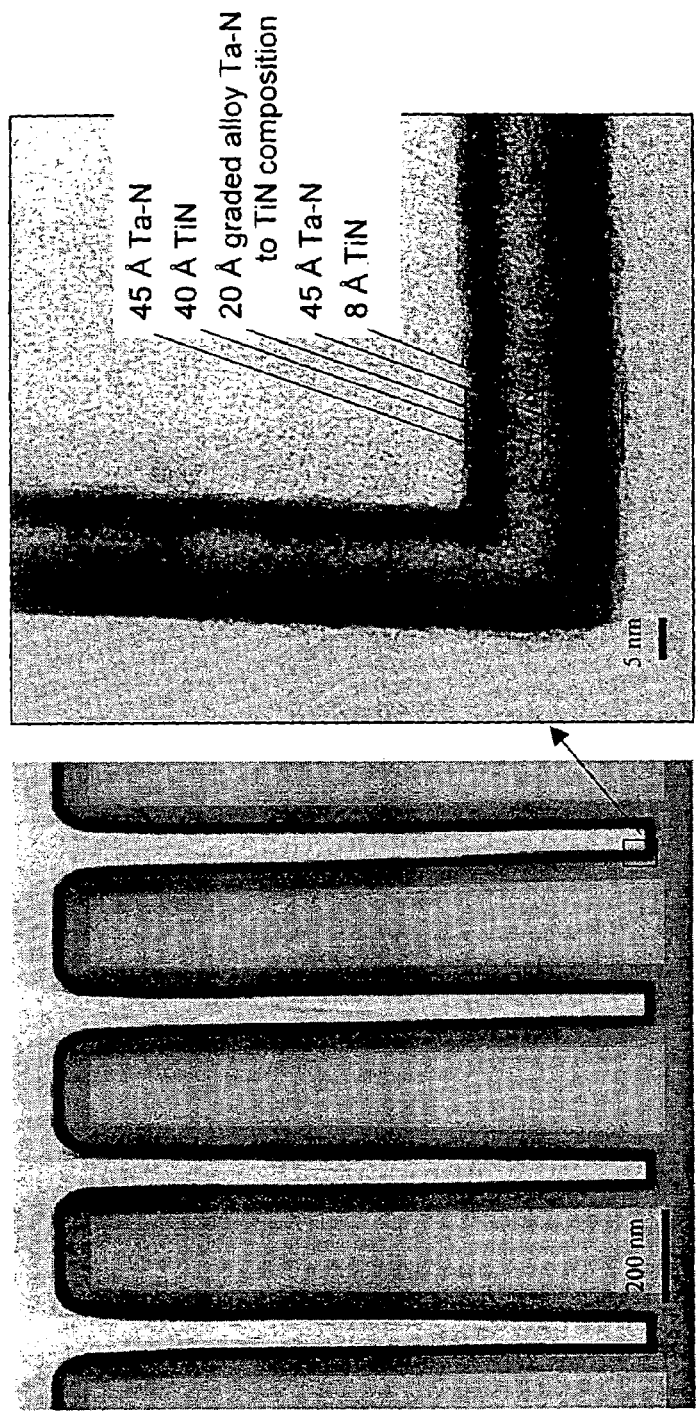
FIG. 11 illustrates characteristics of composite engineered films of the present invention by showing TEM image of multi-layer structure deposited by ALD over a 850 Å wide, 14:1 aspect ratio trench structures

Using Table 2 and FIGS. 5–11 as guidelines, a multi-layered stack structure of the present invention can be designed, consisting of sub-layers of films with different composition and thickness. Thus the properties of the multi-layered stack of various embodiments of the present invention can be tuned to yield the desired performance. Engineered composite films and multi-layered structures of the present invention retain the universal benefits of ALD. For example, FIG. 11 shows a transmission electron microscopy (TEM) image of a multi-layered stack of TiN and TaN sub-layers and a layer with composition gradually transitioning from Ta—N to TiN, deposited over a 850 Å wide, 14:1 aspect ratio trench structures. All layers are 100% conformal and show complete coverage along the bottom of the features. Such excellent coverage and adherence is key to device performance and reliability.

In various embodiments, the composite structures of the present invention can, (i) optimize adhesion, and ALD initiation, to the underlying material(s) and provide for a low contact resistance, (ii) provide for a high quality thin diffusion barrier with low resistivity, and (iii) provide for a surface crystallography texture to provide for the proper subsequent interconnect film integration and device performance. In the case of barriers, a so-called (111) crystallographic texture is desired to provide a preferred template for the next film (i.e., Cu) to-be-deposited in the integration scheme of interconnects. As a result, the subsequent texture of the resulting interconnect is better suited for high electromigration resistance. Additionally, in various embodiments the barrier surface needs to maintain certain adhesion properties for the deposition of the seed or interconnect metal to be integrated on top of the barrier. The engineering of the surface is thus critical for the integration of the subsequently deposited films. Thus, to meet this requirement a different composition may be needed at the surface termination.

In various embodiments of the present invention, the first layer of the CEBA structure serves to optimize adhesion to a number of different underlying materials in the various parts of the wafer topography. A list of commonly used materials includes, but is not limited to: SiO$_2$, low-k insulators, high-k oxide dielectrics, etch-stop layers, such as SiNx, conductive films, such as Cu, WSix, W, TiSi$_2$, CoSi$_2$, NiSix, and exposed sections of barriers (not part of CEBA). Additionally, this CEBA layer must provide for a low contact (via) resistance in areas where the barrier is in contact with underlying conductive films, for example, at the bottom of the vias in damascene processing.

There are numerous embodiments for the CEBA structure of the present invention. The following describes the concept for one embodiment of a structure of the present invention that meets the requirements set forth in the preceding paragraph.

Figure 12:
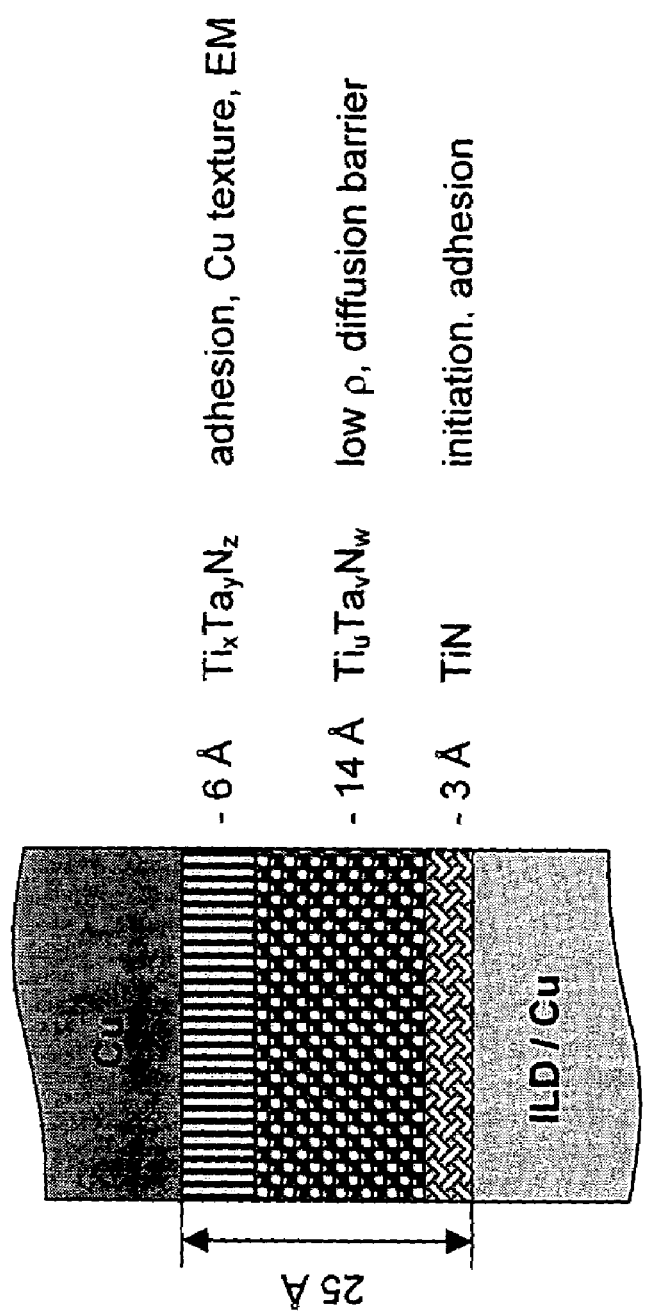
FIG. 12 illustrates one embodiment of a composite engineered barrier by ALD (CEBA) structure of the present invention.

In a preferred embodiment of the present invention illustrated in FIG. 12 the surface of the substrate is activated for ALD through a suitable pretreatment, such as thermal or plasma exposure using for example: H$_2$, NH$_3$, N$_2$, or mixtures thereof, etc. TiN is employed as the adhesion layer and also provides for low contact resistance. A Ti$_u$Ta$_v$N$_w$ alloy of appropriate composition is one embodiment of the film used for the bulk barrier of the CEBA structure. This is engineered to provide suitable low resistivity and act as a Cu diffusion barrier. In this embodiment, the upper layer of the barrier is Ti$_x$Ta$_y$N$_z$, with a composition that provides a (111) texture template for subsequent Cu deposition.

In another embodiment of the present invention TiN is employed as the adhesion layer and also provides for low contact resistance, the second layer is a Ti$_u$Ta$_v$N$_w$ alloy of appropriate composition engineered to provide suitable low resistivity and act as a Cu diffusion barrier. The interface between the first TiN layer and the Ti$_u$Ta$_v$N$_w$ alloy is graded by gradually increasing the Ta concentration from "0" in the TiN to the desired value "y" in the Ti$_u$Ta$_v$N$_w$ alloy. The third layer is Ti$_x$Ta$_y$N$_z$ alloy with a composition that provides a (111) texture template for subsequent Cu deposition.

In another embodiment of the present invention TiN is employed as the adhesion layer and also provides for low contact resistance, the second layer is a Ti$_u$Ta$_v$N$_w$ alloy of appropriate composition engineered to provide suitable low resistivity and act as a Cu diffusion barrier and the third layer is a Ti$_x$Ta$_y$N$_z$ alloy with a composition that provides a (111) texture template for subsequent Cu deposition. The interface between the second Ti$_u$Ta$_v$N$_w$ layer and the Ti$_x$Ta$_y$N$_z$ alloy is graded by gradually changing the Ta concentration from the value in the first alloy to the value in the second alloy.

In another embodiment of the present invention TiN is employed as the adhesion layer and also provides for low contact resistance, the second layer is a TiN/TaNx microlayered film of appropriate coarseness engineered to provide suitable low resistivity and act as a Cu diffusion barrier, and the third layer is a $Ti_xTa_yN_z$ alloy with a composition that provides a (111) texture template for subsequent Cu deposition.

In another embodiment of the present invention one or more layers in the CEBA structure can be fabricated using metals, such as W or Ti, which may be deposited by thermal or plasma assisted ALD. In other embodiments of the present invention, a Radical Assisted process can be employed using $TaCl_5$, $NH_3$ and $H_2$ plasma to grow one or more of the sub-layers in a CEBA structure.

In one embodiment a suitable adhesion layer can be ALD TiN with a thickness in the range of 1–10 Å. The bulk barrier region of the CEBA can be an alloy of, by way of illustration and without limitation, ALD: Ti—Ta—N at (1–10 at. % Ta) [average composition] where the total thickness is 10–100 Å, optimized for attaining the lowest resistivity while maintaining good diffusion barrier properties. Again, by way of illustration and without limitation, for ~10 at. % Ta, the alloy can be fabricated by alternation of 5 ALD cycles of TiN with 1 ALD cycle of TaNx. The total number of cycles is calculated to provide approximately 20 Å. The upper (111) textured surface can be ALD: Ti—Ta—N at (10–20 at. % Ta) such that a (111) texture is dominant. Again, by way of illustration and without limitation this can be achieved by alternation of 3 or 4 ALD cycles of TiN with 1 ALD cycle of TaNx.

In another embodiment of the present invention, the bulk barrier can have a micro-layering coarseness that is a trade off for best barrier properties vs. lowest resistivity. This film can have the finest microlayering for the chosen composition, e.g., for ~100 Å total thickness and average 10 at. % Ta, 5 monolayers of TiN and 1 monolayer of TaNx would be repeated ~6 times. The upper (111) textured surface can be ALD: Ti—Ta—N at (10–20 at. % Ta) such that a (111) texture is dominant. This can be achieved using an alloy or a microlayered structure with minimal granularity. In another embodiment, a second CEBA layer with higher granularity may used, e.g., for ~100 Å total thickness, and average 10 at. % Ta, 10 monolayers of TiN and 2 monolayers of TaNx would be repeated ~3 times.

It should be clear to one skilled in the art that CEBA may be implemented with a variety of composite materials other than TiTaN. These may include without limitation TiSiN, TiWN, TaSiN, TiMoN, WSiN etc. Additionally, quaternary materials such as TiTaSiN, TiWSiN, TaWSiN, etc., may be needed.

In another area of application the CEBA structure can be used as an electrode barrier in the metal-insulator-metal (MIM) type capacitor. In this case, for example, the electrodes can act as a barrier ("electrode-barrier") for copper diffusion when the capacitor is embedded between two copper interconnect lines.

For the upper electrode, the normal core CEBA layering sequence is followed, but the first layer to be deposited on the insulator "I" must have a metallic high free carrier concentration in addition to the property of good adhesion. The first layer is composed of a material, which is inert with respect to thermal integration so as not to allow the development of parasitic oxide at the CEBA-insulator interface. Such materials may be metals (in particular refractory metals), metal nitrides, composite microlayers or alloys of W, Ta, Ti or TiN, WN or TaNx. The second CEBA layer is the barrier, engineered using a composite alloy or microlayering approach, and the third layer will have (111) texture for the deposition of a Cu interconnect.

For the lower electrode case, the core CEBA is an inverted sequence. The first layer in addition to providing good adhesion, has a (111) texture and is deposited on the lower Cu interconnect. The second layer is again a metallic barrier of alloy or micro-layered material. The third layer—suitable for its application—is engineered for a metallic high free carrier concentration, and is composed of a material which is inert with respect to thermal integration so as not to allow the development of parasitic oxide at the CEBA—lower insulator interface. In the use of the inverted CEBA for the MIM application, the CEBA contact to the lower metal Cu interconnect is selected with (111) texture to guard against texture modification under device operation. When the first layer in the CEBA has (111) texture, the underlying Cu layer which already could be designed with (111) texture has much less likelihood to change texture under high current density (AC or DC) operation, thereby improving device reliability.

In the present invention, the modified CEBA concept meets all the requirements for integrating the MI and IM interfaces of the MIM capacitor as the barrier prevents Cu from diffusing into the insulating dielectric layer from either top or bottom Cu interconnects. The architecture of the MIM embedded capacitor amongst the Cu interconnects may be "planar" or 3 dimensional as within an inlaid damascene structure.

Although MIM structure was discussed as an example, the application may also be incorporated in MIS, SIM or SIS capacitor structures, wherein the "S" electrode for one or both electrodes are heavily doped semiconductors.

In yet another area of applications of CEBA to advanced metal gate transistors, a transistor structure can be advantageously constructed. The CEBA layer will be used to provide adhesion (through surface reactive chemistry) but functionally also sets the work function of the MIS transistor structure. The concept is to select metal materials so the work function simulates that of n+ silicon (for NMOS) and p+ silicon for pMOS devices, so as to provide for an overall dual work function CMOS metal gate technology.

For example, this can be molybdenum (Mo) (for n-type devices) and MoN (for p-type devices) (H. H. Tseng, 2001 IEDM Short Course: "Gate Dielectrics and Gate Materials"), while it is possible that other metals may be used. The selection of Mo and use of ALD Mo may be a preferred ALD embodiment. Mo can be used for the first layer in the core CEBA stack directly on the dielectric (having standard K or high K>7 value) of the gate. The thickness of the first layer of the CEBA may be a few 10's of Å, enough to set the work function relative to the underlying silicon. In the process integration sequence this may be followed by a selective masked area nitrogen (N) implant or a selective chemical reaction with N, using a hard mask to form selective MoN for the p-type devices. The implementation of a single work function gate process is obvious to one skilled in the art. The second layer of the CEBA can be built using an alloy or microlayering of the TiN/TaNx or the like materials, suitable for acting as a diffusion barrier for the materials to be placed in the upper part of the metal gate.

After completing the CEBA with suitable (111) surface microstructure, a low resistivity metal cladding layer such as a Cu film may be deposited which completes the CMOS transistor stack. The overall result is a ultra low resistivity gate CMOS transistor structure stack, from the top down, composed of, e.g., Cu, CEBA barrier stack and dielectric. Alternatively, several low resistivity (on the order of or less than 20 μΩ-cm) metal gates may be fabricated such as Al, W, Ag, as well as Cu. In the case of metals different than Cu, the third CEBA layer is selected to provide a template for the best texture for the particular subsequent metal.

The role of the CEBA in these high performance CMOS devices is to functionally reduce or stop impurity diffusion into the MOS transistor's gate insulator and silicon active areas, from the metallic gate elements (e.g., Cu) or parasitic remnant chemicals such as F, Cl, C, N that may be deposited in the film during film deposition by chemical methods.

Figure 13:
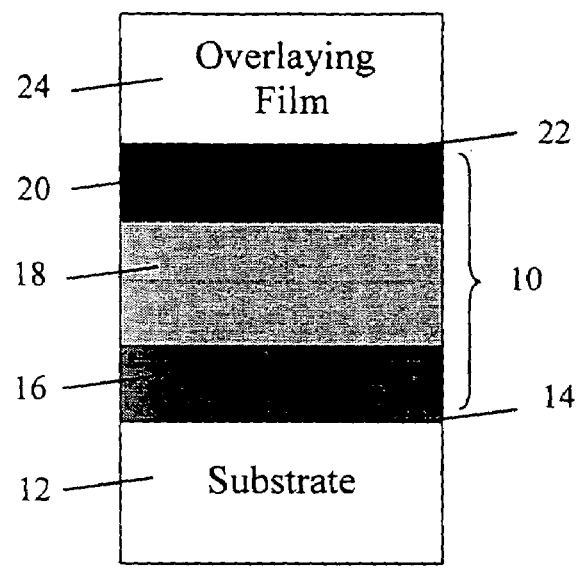
FIG. 13 illustrates another embodiment of a CEBA structure of the present invention.

Referring now to FIG. 13, in various embodiments of the present invention, a composite film, generally denoted as 10, is formed on a substrate 12 that has a substrate interface surface 14. A first layer 16 is formed on the substrate interface surface 14. First layer 16 may provide adhesion to substrate interface surface 14 and initiation of layer by layer ALD growth. A second layer 18 is formed between first layer 16 and one or more third layers 20. Second layer 18 provides a conducting diffusion barrier between substrate 12 and a subsequent overlaying film 24. Third layer 20 has a surface 22 that provides adhesion and a texture template in preparation for the subsequent overlaying film 24.

Generally in this embodiment, first, second and third layers 16, 18 and 20 each have a composition M1xM2yNz, where M1 and M2 are selected from the group Ti, Ta, W, Si, Nb, Mo, Co; x is 0 to 0.9, y is 0 to 0.9, z is 0 to 0.5, where x+y+z=1. First, second and third layers 16, 18 and 20 can each have different compositions and M1x and M2y are different.

In another embodiment, any two of first, second and third layers 16, 18 and 20 have the same composition.

Layers 16, 18 and 20 can be formed by (i) thermal or plasma assisted ALD using halides and hydrides, (ii) thermal or plasma assisted ALD using halides and silane chemistries, (iii) thermal or plasma assisted ALD using metal-organics and hydrides, (iv) ALD using metal-precursors and atomic hydrogen, and the like. In one specific embodiment, first and third layers 16 and 20 can be formed by thermal or plasma assisted ALD and second layer 18 is formed by a CVD process, or a mixture of ALD and CVD processes.

Composite film 10 can act as a diffusion barrier for Cu, Al, W, F, Cl, and the like. The function of the diffusion barrier is to stop or limit to a sufficient degree the physical penetration of atomic concentrations of Cu, Al, W, F, Cl, etc., into the interlayer dielectric or away from the IC body. In one specific embodiment, at least one of the first, second and third layers 16, 18 or 20 has an interface that can act to capture migrating impurities including but not limited to O, C, Cl, F, N, K, B, Na and the like. In this mechanism impurities may initially diffuse from the IC body, but be trapped at various interfaces in the CEBA structure of the present invention, thereby limiting the degree of physical penetration of the atomic species into the insulator dielectric.

In one specific embodiment, first layer 16 seals a topography of substrate 12 which can be a porous dielectric. The topography can have a tri-dimensional structure or be planar. In the porous case the substrate 12 can have a pore size in the range of 4 to 40 Å. In another embodiment, composite film 10 is deposited on a single or dual damascene topography.

Figure 14:
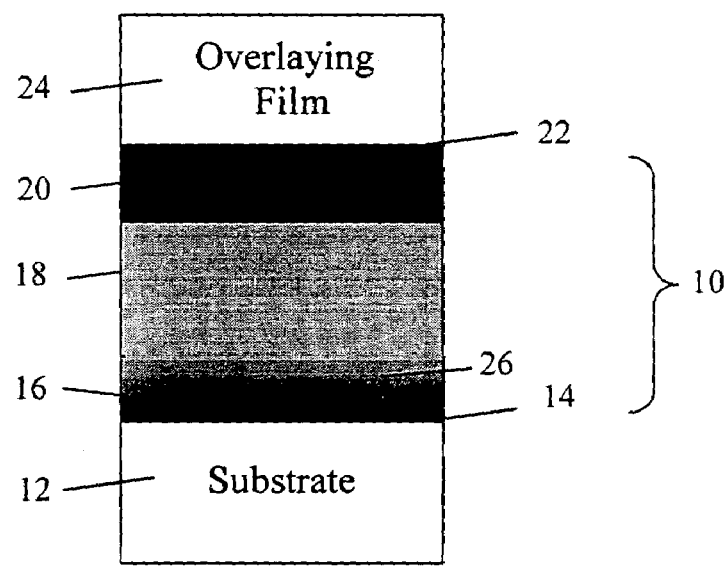
FIG. 14 illustrates one embodiment of a CEBA structure of the present invention where one interface is graded

The composite film illustrated in FIG. 13 can be modified as shown in FIG. 14 where at least one transition region 26 between first and second layers 16 and 18, or between second and third layers 18 and 20 has a graded composition.

Figure 15:
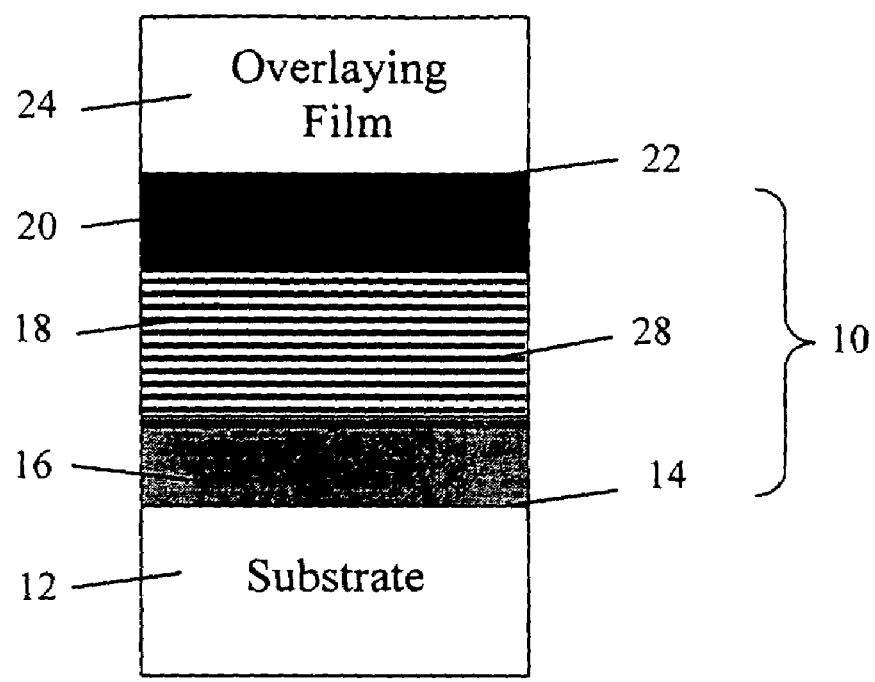
FIG. 15 illustrates one embodiment of a CEBA structure of the present invention that incorporates a micro-layered second layer

The composite film of FIG. 13 can also be modified, as illustrated in FIG. 15, so that second layer 18 includes a micro-layered structure 28.

Figure 16:
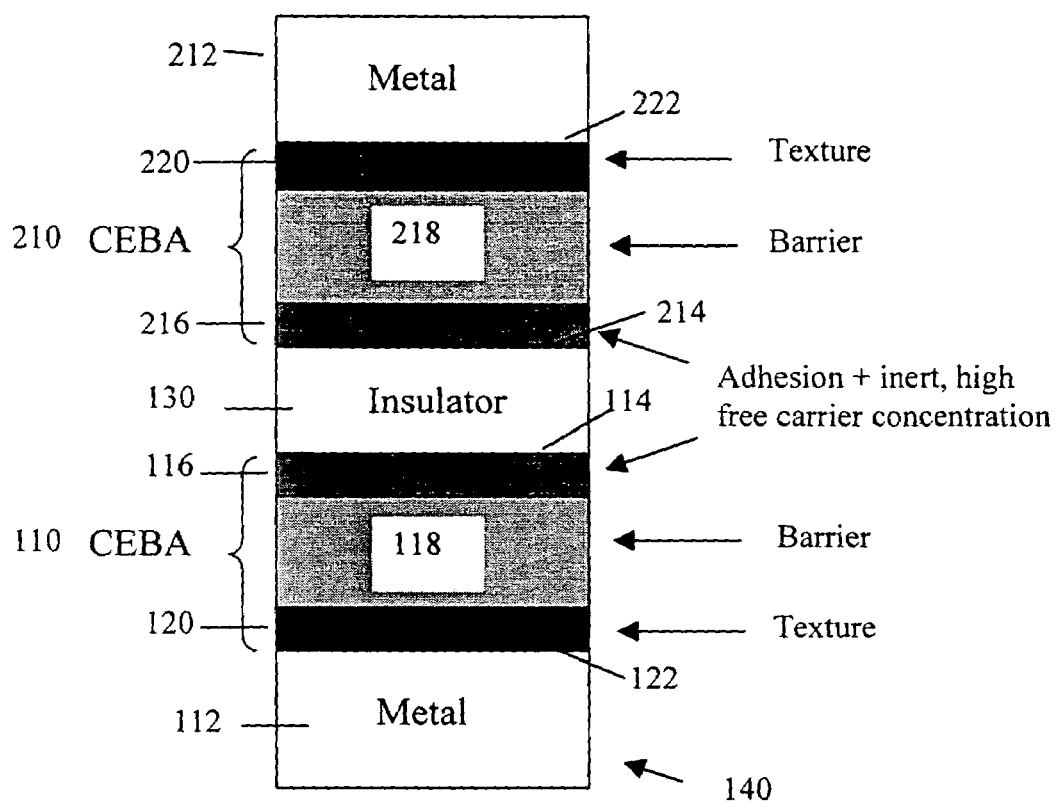
FIG. 16 illustrates one embodiment of a CEBA structure of the present invention in a Metal-Insulator-Metal (MIM) capacitor with embedded CEBAs

The MIM capacitor 140 is illustrated in FIG. 16—the two CEBA inserts provide the attributes of the regular CEBA 210 (upper M) and an inverted CEBA 110 (lower M) for contacting upper 212 and lower 112 metal layers with CEBA barriers. The composite films again allow for the second layers 118 and 218 to be an alloy (or a micro-layered structure), or have a graded structure in the transition region of the interface regions 122 and 222 attaching to the metal layers.

In the embodiment illustrated in FIG. 16, a composite film 110 is formed on a substrate 112 with a substrate interface surface 122. A first layer 120 is coupled to substrate interface surface 112. First layer 120 provides adhesion and texture for the underlying (Cu) metal 112. A second layer, positioned between first layer 120 and a third layer 116, provides a conducting thermal diffusion alloy barrier 118 between substrate 112 and the subsequent overlaying insulator film 130. Third layer 116 has a high free carrier concentration at interface 114 and is selected with inertness to formation of parasitic oxide under thermal process integration with the insulator 130.

Additionally in the embodiment of FIG. 16, a composite film 210 is formed on a substrate insulator 130 with a interface surface 214. A first layer 216 above the insulator 130 is coupled to substrate interface surface 214. Layer 216 has a high free carrier concentration at interface 214 and is selected with inertness to formation of parasitic oxide under thermal process integration with the insulator 130. A second layer 218, positioned between first layer 216 and a third layer 220, provides a conducting thermal diffusion alloy barrier 218 between the first layer 216 and the overlaying texture setting film 220 for Cu connection at interface 222.

Figure 17:
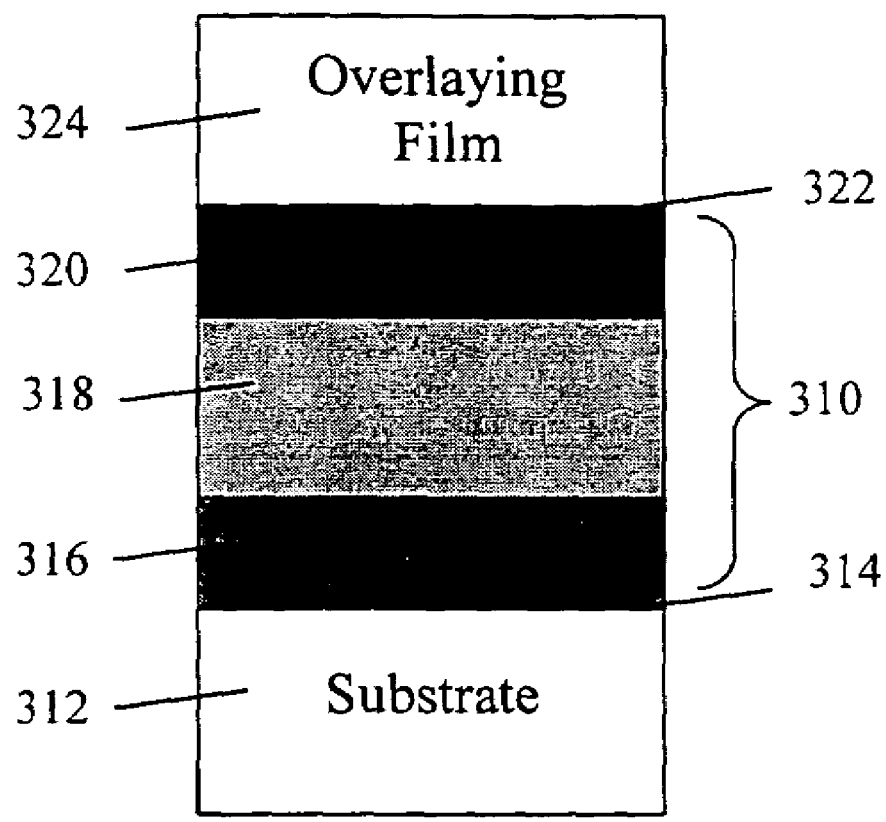
FIG. 17 illustrates one embodiment of a CEBA structure of the present invention in a low resistivity metal gate with CEBA used in a MOSFET

One embodiment of CEBA into a MIS low resistivity dual work function gate transistor is shown in FIG. 17. This is illustrated as a functional modification to composite engineered barrier film illustrated in FIGS. 13, 14 or 15. A composite film 310 is formed on a substrate 312 that has a substrate interface surface 314. The first layer 316 is an adhering layer of metal that sets the work function for the gate to the silicon for suitable nMoS or pMOS operation. The second layer may include a composite alloy 318 between the first and third layers 316 and 320. One or both of second and third layers 318 and 320 may have a graded composition. The third layer 320 has a suitable (111) microstructure template setting texture for a low resistivity (e.g., Cu) gate transistor, providing for good current carrying capability in the Cu when used as a local interconnect.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A metal insulator-metal structure (MIM structure), comprising:
   an upper metal layer;
   an upper composite engineered barrier layer made by an ALD process and disposed below the upper metal layer;
   an insulator disposed below the upper composite engineered barrier layer;
   a lower composite engineered barrier layer made by an ALD process disposed below the insulator; and a lower metal layer disposed below the lower composite engineered barrier layer.

2. The MIM structure of claim 1, wherein the MIM structure is deposited on a damascene topography.

3. The MIM structure of claim 1, wherein the upper composite engineered barrier layer comprises a plurality of sublayers, further comprising:

a first sublayer coupled to an upper interface surface of the insulator, the first sublayer providing adhesion to the upper interface surface and providing initiation of layer by layer ALD growth; a third sublayer configured to provide adhesion and desired texture to the upper metal layer; and a second sublayer, positioned between the first sublayer and the third sublayer providing a conducting diffusion barrier between the upper metal layer and the insulator; and the lower composite engineered barrier layer comprises a plurality of sublayers, further comprising:

a fourth sublayer coupled to an upper interface of the lower metal substrate, the fourth sublayer providing adhesion and has the desired texture to the lower metal layer, and providing initiation of layer by layer ALD growth; a sixth sublayer configured to provide adhesion to a lower interface surface of the insulator; and a fifth sublayer, positioned between the fourth sublayer and the sixth sublayer providing a conducting diffusion barrier between the lower metal layer and the insulator.

4. The MIM structure of claim 3, wherein the first sublayer has a high free carrier concentration and is inert with respect to thermal integration; and wherein the sixth sublayer has a high free carrier concentration and is inert with respect to thermal integration.

5. The MIM structure of claim 3, wherein the sublayers of at least one of the upper composite engineered barrier layer or the lower composite engineered barrier layer have a composition M1xM2yNz, where M1 and M2 are selected from the group Ti, Ta, W, Si, Nb, Mo, Co; x is 0 to 0.9, y is 0 to 0.9, z is 0 to 0.5, where x+y+Z=1 the sublayers each having different compositions and M1x and M2y are different.

6. The MIM structure of claim 3, wherein the sublayers of at least one of the upper composite engineered barrier layer or the lower composite engineered barrier layer have a composition M1xM2yNz, where M1 and M2 are selected from the group Ti, Ta, W, Si, Nb' Mo, Co; x is 0 to 0.9, y is 0 to 0.9, z is 0 to 0.5, where x+y+Z=1, M1x and M2y are different and any two of the sublayers have the same composition.

7. The MIM structure of claim 3, wherein sublayers of at least one of the upper composite engineered barrier layer or the lower composite engineered barrier layer have a composition TixTayNz, where x is 0 to 0.9, y is 0 to 0.5, z is 0 to 0.5, and the sublayers each have different compositions.

8. The MIM structure of claim 3, wherein the sublayers of at least one of the upper composite engineered barrier layer or the lower composite engineered barrier layer, respectively, have a composition TiN, TixTayNz, TixTayNz, where x is 0.3–0.5, y is 0.01–0.15, and z is 0.45–0.50 and at least two of the sublayers have different compositions.

9. The MIM structure of claim 3, wherein the MIM structure is a diffusion barrier for Cu, Al, W, F, Cl.

10. The MIM structure of claim 3, wherein at least one of the sublayers have an interface that acts to capture migrating impurities.

11. The MIM structure of claim 10, wherein the migrating impurities include O, C, Cl, F, N, K, B and Na.

12. A metal insulator-metal structure (MIM structure) that is positioned between any two levels of Cu interconnects in a multi-level Cu interconnect system, comprising:

an upper Cu interconnect metal layer;

an upper composite engineered barrier layer made by an ALD process and disposed below the upper Cu interconnect metal layer;

an insulator disposed below the upper composite engineered barrier layer;

a lower composite engineered barrier layer made by an ALD process disposed below the insulator; and a lower Cu interconnect metal layer disposed below the lower composite engineered barrier layer.

13. The MIM structure of claim 12, wherein the upper composite engineered barrier layer comprises a plurality of sublayers, further comprising:

a first sublayer coupled to an upper interface surface of the insulator, the first sublayer providing adhesion to the upper interface surface and providing initiation of layer by layer ALD growth; a third sublayer configured to provide adhesion and desired texture to the upper Cu metal layer; and a second sublayer, positioned between the first sublayer and the third sublayer providing a conducting diffusion barrier between the upper Cu metal layer and the insulator; and the lower composite engineered barrier layer comprises a plurality of sublayers, further comprising:

a fourth sublayer coupled to an upper interface of the lower Cu metal substrate, the fourth sublayer providing adhesion and has the desired texture to the lower Cu metal layer, and providing initiation of layer by layer ALD growth; a sixth sublayer configured to provide adhesion to a lower interface surface of the insulator; and a fifth sublayer, positioned between the fourth layer and the sixth layer providing a conducting diffusion barrier between the lower Cu metal layer and the insulator.

14. The MIM structure of claim 13, wherein the first sublayer has a high free carrier concentration and is inert with respect to thermal integration; and wherein the sixth sublayer has a high free carrier concentration and is inert with respect to thermal integration.

* * * * *